(12) United States Patent
Sharma et al.

(10) Patent No.: US 10,679,708 B2
(45) Date of Patent: Jun. 9, 2020

(54) PRE-PROGRAM READ TO COUNTER WORDLINE FAILURES

(71) Applicant: Western Digital Technologies, Inc., San Jose, CA (US)

(72) Inventors: Sahil Sharma, San Jose, CA (US); Nian Yang, Mountain View, CA (US); Philip David Reusswig, Mountain View, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/133,552

(22) Filed: Sep. 17, 2018

(65) Prior Publication Data
US 2020/0090759 A1    Mar. 19, 2020

(51) Int. Cl.
| | | |
|---|---|---|
| *G11C 16/26* | (2006.01) | |
| *G11C 16/04* | (2006.01) | |
| *G11C 16/14* | (2006.01) | |
| *G11C 16/10* | (2006.01) | |
| *G11C 11/56* | (2006.01) | |
| *G11C 16/34* | (2006.01) | |

(52) U.S. Cl.
CPC ......... *G11C 16/26* (2013.01); *G11C 11/5628* (2013.01); *G11C 11/5635* (2013.01); *G11C 11/5642* (2013.01); *G11C 11/5671* (2013.01); *G11C 16/0483* (2013.01); *G11C 16/10* (2013.01); *G11C 16/14* (2013.01); *G11C 16/3495* (2013.01); *G11C 16/3459* (2013.01)

(58) Field of Classification Search
CPC .............................. G11C 6/26; G11C 11/5628

USPC ..................................................... 365/185.09
See application file for complete search history.

(56) References Cited

U.S. PATENT DOCUMENTS

| | | | | |
|---|---|---|---|---|
| 5,848,000 | A | * | 12/1998 | Lee .......................... G11C 8/10 365/185.23 |
| 6,307,778 | B1 | | 10/2001 | Micheloni et al. |
| 6,519,184 | B2 | | 2/2003 | Tanaka et al. |
| 8,407,449 | B1 | * | 3/2013 | Colon .................. G06F 12/0246 711/103 |
| 8,787,088 | B2 | | 7/2014 | Dutta et al. |
| 9,311,970 | B2 | * | 4/2016 | Sharon ................ G06F 11/1072 |
| 9,548,129 | B2 | | 1/2017 | Paudel et al. |
| 9,582,192 | B2 | * | 2/2017 | Choudhuri ............ G06F 3/0608 |

(Continued)

*Primary Examiner* — Hoai V Ho
*Assistant Examiner* — Muna A Techane
(74) *Attorney, Agent, or Firm* — Morgan, Lewis & Bockius LLP

(57) ABSTRACT

Disclosed are systems and methods for providing pre-program read to counter wordline failures. A method includes performing a read operation on a first portion of a flash memory in response to an erase operation on a second portion of the flash memory, wherein the first portion comprises a plurality of logical wordlines corresponding to a plurality of physical wordlines of the second portion. The method also includes counting, for each of the plurality of logical wordlines, a number of memory cells exceeding a threshold error voltage and marking defective physical wordlines in a bitmap. The method also includes performing a write operation into a third portion of the flash memory that includes at least one physical wordline marked as defective in the error bitmap, wherein a predetermined data pattern is written to a lower page of the at least one physical wordline.

10 Claims, 5 Drawing Sheets

(56) References Cited

U.S. PATENT DOCUMENTS

| | | |
|---|---|---|
| 9,613,711 B2 | 4/2017 | Kim et al. |
| 9,792,998 B1 | 10/2017 | Yang et al. |
| 9,842,059 B2 * | 12/2017 | Kamruzzaman ...... G06F 12/109 |
| 10,025,664 B2 * | 7/2018 | Gerhart ................. G06F 3/0619 |
| 10,289,408 B2 * | 5/2019 | Gerhart ..................... G06F 8/65 |
| 10,379,948 B2 * | 8/2019 | O'Krafka ............ G06F 11/1076 |
| 2003/0165076 A1 * | 9/2003 | Gorobets .............. G06F 3/0613 |
| | | 365/200 |
| 2014/0075093 A1 * | 3/2014 | Wiesner ............. G06F 12/0246 |
| | | 711/103 |
| 2014/0247666 A1 | 9/2014 | Dutta et al. |
| 2018/0075919 A1 | 3/2018 | Pang et al. |

\* cited by examiner

FIG. 1A
FIG. 1B
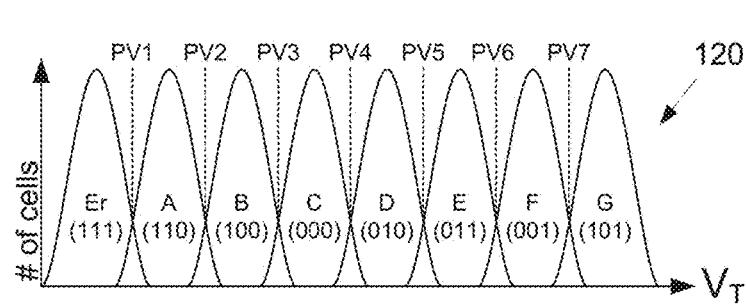
FIG. 1C
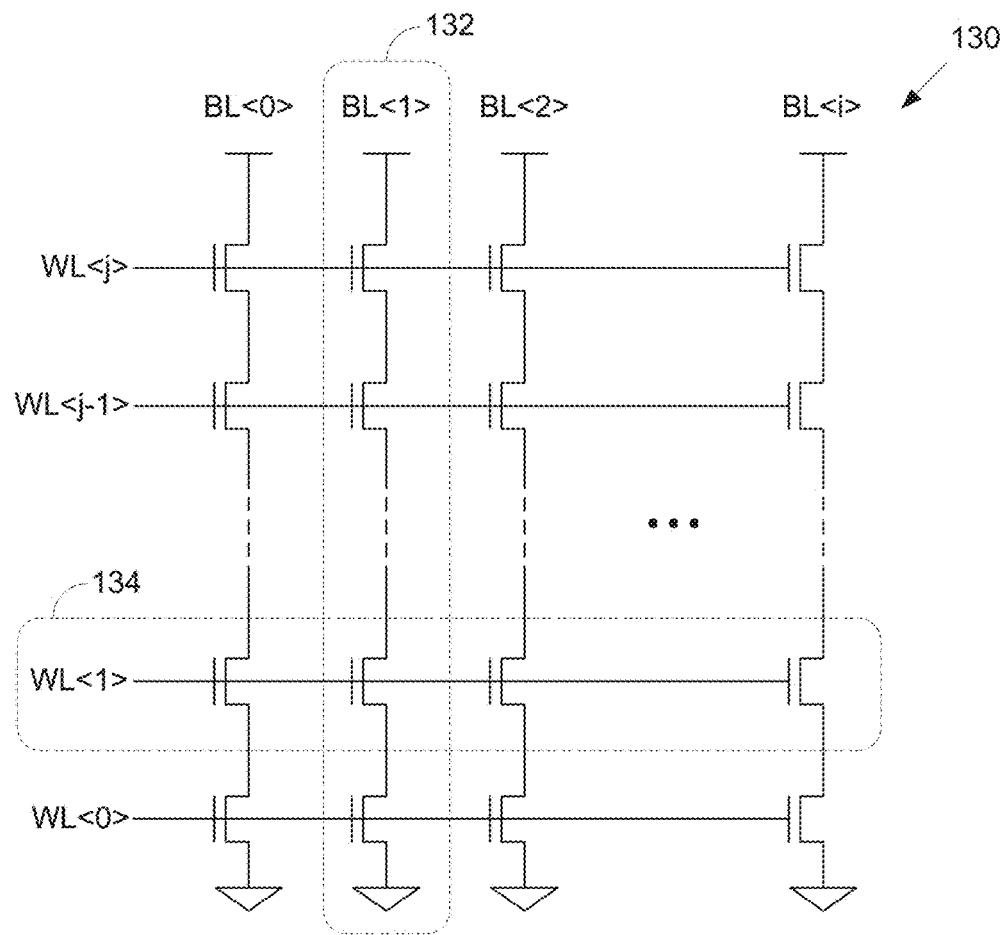

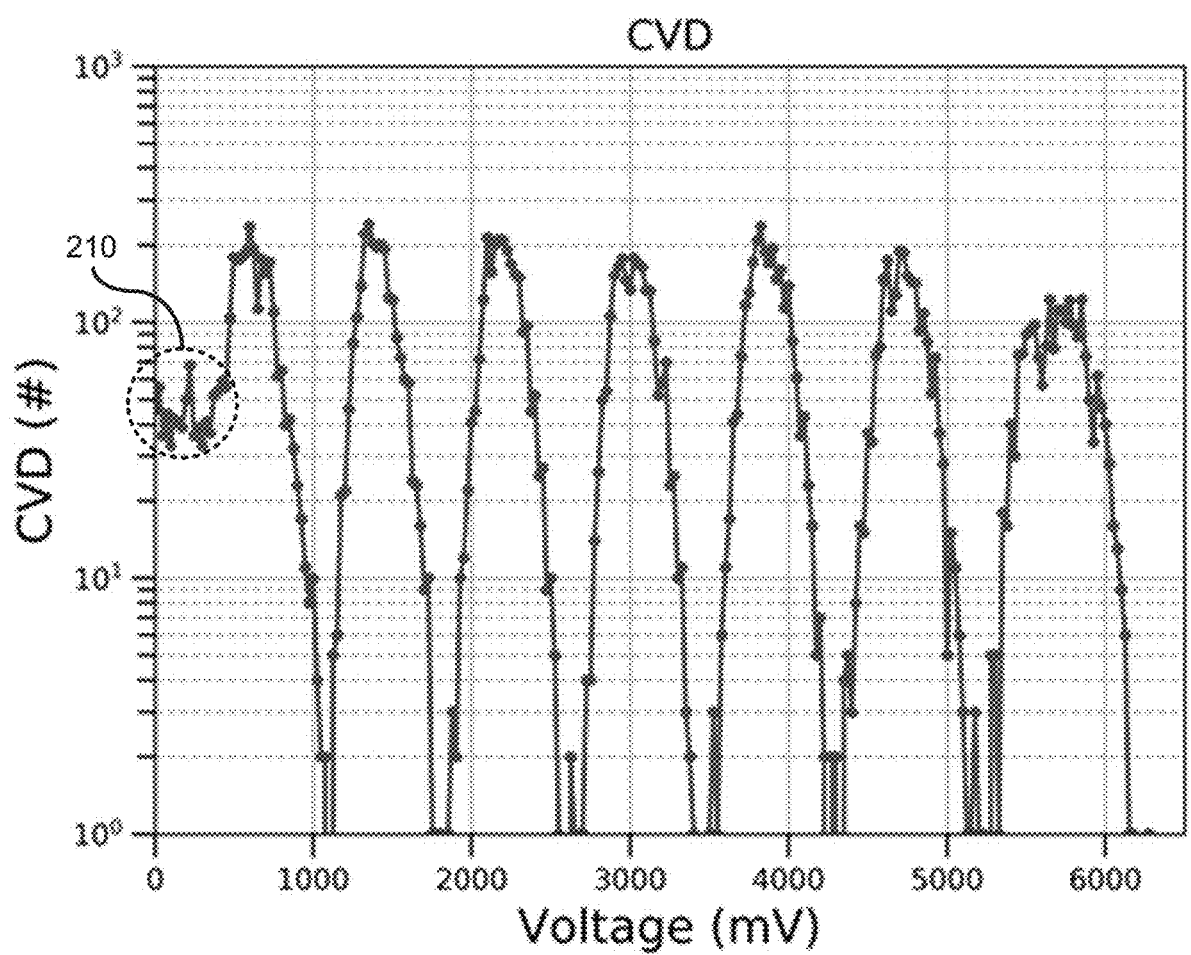

PRE-PROGRAM READ TO COUNTER WORDLINE FAILURES

BACKGROUND

Due to imperfect manufacturing processes and other factors, flash memory such as not and (NAND) flash memory may be fabricated with defects that may lead to increased bit error rate (BER) during operation. The increased BER may cause a controller of a flash memory storage device to mark affected blocks as bad blocks, which in turn reduces the endurance and performance of flash memory storage devices. Thus, there is a need for a more efficient method of error correction for flash memory storage devices.

The description provided in the background section should not be assumed to be prior art merely because it is mentioned in or associated with the background section. The background section may include information that describes one or more aspects of the subject technology.

BRIEF DESCRIPTION OF THE DRAWINGS

A detailed description will be made with reference to the accompanying drawings:

FIGS. 1A, 1B and 1C illustrate examples of coding, a program distribution, and a circuit diagram.

FIG. 2 is a graph illustrating an example multi-level cell (MLC) distribution affected by erase to first state (E→A) tail.

DETAILED DESCRIPTION

Figure 3:
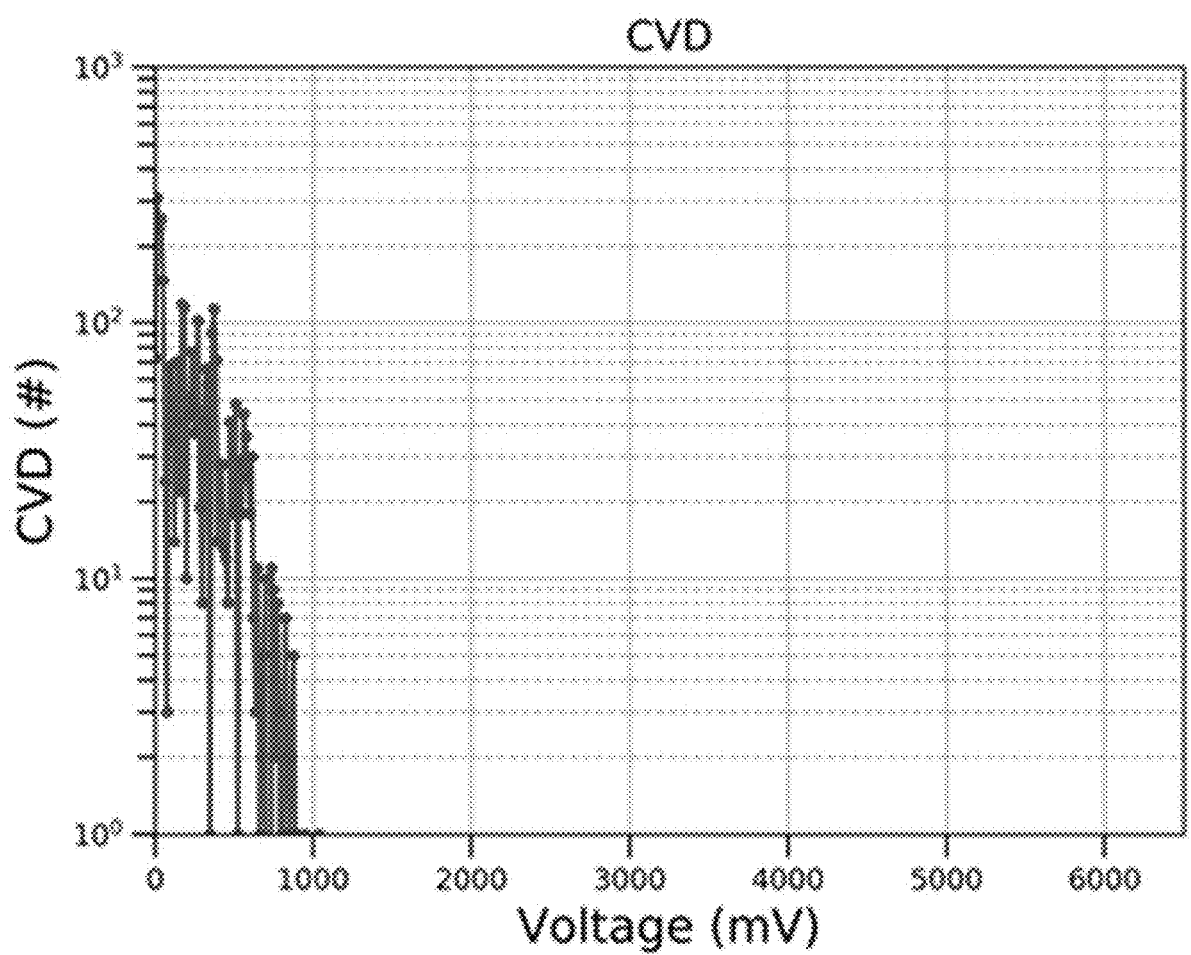
FIG. 3 is graph illustrating an example MLC distribution affected by E→A tail after an erase operation.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology may be practiced without these specific details. In some instances, structures and components are shown in block diagram form in order to avoid obscuring the concepts of the subject technology. Like components are labeled with identical element numbers for ease of understanding.

The present description relates in general to data storage systems, and more particularly to, for example, without limitation, providing pre-program read to counter wordline failures. Due to imperfect fabrication tools, NAND flash memory devices may exhibit a particular failure mode described as erased state to first state tail, or E→A tail. Flash memory devices exhibiting this failure mode read higher voltages between the erased and first states, or in the lower page for multi-level cells (MLC). For example, memory cells in the erased state that are expected to be read as zero voltage (0V) may instead be read as voltages higher than 0V. In a voltage distribution graph for erased cells, these higher voltages may appear as a "tail" for cells that are between the erased state and the first state. This is an example of the E→A tail. These higher voltages may trigger the error correction algorithms of a storage device controller to mark affected flash memory blocks as bad blocks, removing such blocks entirely from active usage.

One or more implementations of methods and systems are provided for pre-program read to counter wordline failures (e.g., to counter NAND single logical wordline failures). When programming to NAND flash memory, a controller may perform an erase operation to initialize the flash memory prior to programming. In response to such an erase operation, a controller may perform a test read operation to determine which portions of the flash memory are affected by the E→A tail. For example, if a number of memory cell reads exceeding a threshold error voltage, such as 0V, is greater than a threshold error count for a logical wordline, then the logical wordline may be affected by the E→A tail. Once affected logical wordlines are determined, the corresponding physical wordlines may be marked as bad in an error bitmap, rather than marking the entire block as bad. To facilitate error correction and parity calculation algorithms, the programming operation may continue to program padding data to the affected pages, such as by writing a predetermined data pattern known by the error correction and parity calculation algorithms.

Since the described pre-program read incurs some overhead, various approaches may minimize such overhead. As the E→A tail is known to affect primarily the erased state to first state transition, the test read operation can be limited to the lower pages, rather than reading all of the pages. Additionally, rather than testing an entire physical wordline or physical page, a minimum decodable data unit chunk such as an error correction code (ECC) page or flash memory unit (FMU) corresponding to a logical wordline may be read as a representative sample of the physical wordline. Further, since the E→A tail may tend to affect particular strings that have marginal current leakage performance, which is detectable during the erase operation, the test read operation may be limited to such strings, rather than testing all strings. Yet further, input/output (I/O) overhead can be reduced by reading the error counts directly from latches of the flash memory, rather than sending or toggling the read data back to a storage device controller for counting. By using one or more of these approaches, processing overhead can be minimized.

One or more implementations of the subject technology provide several performance benefits that improve the functionality of a computer. A controller without compensation for the E→A tail may detect flash memory blocks affected by the E→A tail as having multiple errors, which may trigger a removal of such flash memory blocks entirely from active usage. However, since the E→A tail is known to affect only a limited portion of the flash memory, or the transition from the erased state to the first state, detection of the E→A tail enables error correction algorithms to provide a targeted and granular approach to error correction that is resilient against such E→A tail defects. As a result, storage device controllers can efficiently utilize flash memory blocks affected by the E→A tail, helping to extend endurance and improve device performance. For example, since the blocks affected by the E→A tail can be detected and compensated without accruing additional error corrections for the blocks, the bit error count for these blocks can be maintained at lower counts, which helps to extend endurance by keeping these blocks in use for a longer lifecycle before retirement. Additionally, by bypassing error correction that would otherwise be applied to correct the E→A tail, performance may be improved by avoiding waits or bottlenecks from error correction processes. Further, the increased tolerance against E→A tail defects enables improved flash memory yields, helping to lower acquisition and operating costs for device manufacturers and end users.

FIGS. 1A, 1B and 1C illustrate examples of coding, a program distribution, and a circuit diagram for multi-level cell (MLC) flash memory. FIG. 1A includes binary coding 110. FIG. 1B includes distribution 120. FIG. 1C includes circuit 130. Circuit 130 includes string 132 and wordline 134.

Binary coding 110 illustrates an example coding for MLC, or triple level cells (TLC) in particular, which can represent 3 bits of data by storing $2^3$ or 8 possible program states per memory cell, or from an Er (erased) state to a G state. Accordingly, a word line may utilize three pages that include a lower page (LP), a middle page (MP), and an upper page (UP). As shown in binary coding 110, the coding may be a Gray code where adjacent states differ by one bit. For example, the code for the erased state (111) differs from the adjacent A state (110) by the LP bit. Examining binary coding 110, it can be seen that this provides a 2, 3, 2 coding, since the UP and LP include two state transitions from Er to G, whereas the MP includes three state transitions from Er to G. Of course, binary coding 110 is only one example and other codings may be utilized. While TLC is illustrated in FIG. 1, it should be understood that multi-level cell (MLC), quad level cell (QLC), X5, or memory cells with any number of states may also be utilized. For example, if QLC is utilized instead of TLC, binary coding 110 may map four pages representing 16 possible states. Thus, one or more aspects of the present technology may utilize memory cells with any number of states.

Distribution 120 illustrates an example distribution of program states after programming data. For example, the first peak may correspond to an erased (Er) state, the second peak may correspond to a state A, the third peak may correspond to a state B, and so forth until state G. Note that a scale for the vertical axis may be logarithmic.

When memory cells are to be programmed to one of seven possible states, A through G, a respective program verify voltage PV1 through PV7 may be utilized to confirm whether the memory cells have reached the desired state. For example, programming and verify pulses may be alternated until the last verify pulse indicates that all of the programmed memory cells meet or exceed the program verify voltage for the desired program state. PV1 through PV7 may be set to default values and may be further adjusted as the flash memory ages and the peaks in distribution 120 shift and widen.

Circuit 130 illustrates a circuit for an exemplary flash memory block. As shown in circuit 130, the flash memory block is organized into a grid layout with "j" physical wordlines horizontally and "i" bitlines or strings vertically. An example string 132 and wordline 134 are identified in circuit 130. Wordline 134 may represent a page. For example, WL<1> intersecting BL<0> to BL<i> where i=16383 may represent a physical wordline containing 16 kilobits of data, which corresponds to wordline 134. The intersection of a physical wordline with a subset of strings may represent a logical wordline. For example, WL<1> intersecting BL<0> to BL<4095> may represent a logical wordline containing 4 kilobits of data. The logical wordline may represent a minimum decodable data chunk such as an ECC page or FMU.

FIG. 2 is a graph 200 illustrating an example MLC distribution affected by erase to first state (E→A) tail. As shown in graph 200, the X-axis represents voltage (mV) of a memory cell, whereas the Y-axis represents a number of cells having the indicated X-axis voltage in the cell voltage distribution, for example by reading the voltages of memory cells in a particular block, die, or other grouping of memory cells.

As shown in FIG. 2, the E→A tail is visually identifiable in region 210 of graph 200, as demonstrated by the lack of a clear boundary between the erased state and the A state, in contrast with distribution 120. Rather, since the E→A tail defect is causing memory cells that should be in the erased state to read as higher voltages, the erased state appears to bleed into the first state, as indicated by the elevated voltages in region 210. As a result, data may erroneously be read as the first state, which may be later corrected to the erased state by an error correction algorithm. Since this E→A tail may cause multiple such error corrections in a flash memory block, the flash memory block may be marked as bad for exceeding a threshold error count by a conventional storage controller.

FIG. 3 is graph 300 illustrating an example MLC distribution affected by E→A tail after an erase operation. As shown in graph 300, the X-axis represents voltage (mV), whereas the Y-axis represents number of cells in the cell voltage distribution. Graph 300 may represent the distribution of graph 200 after conducting an erase operation.

As shown in graph 300, the effects of the E→A tail are even more pronounced, as the distribution is skewed towards higher voltages approaching 1000 mV when memory cells in the erased state should not exceed 0 V. Thus, the E→A tail can be readily detected after an erase operation by counting a number of memory cells that exceed a threshold error voltage, such as 0 V. If the count of memory cells exceeds a threshold error count for a defined portion of the flash memory, such as a logical wordline, then the corresponding physical wordline of the flash memory can be marked as bad or affected by the E→A tail. For example, an error bitmap may be populated to track the presence of the E→A tail on a physical wordline basis.

Figure 4:
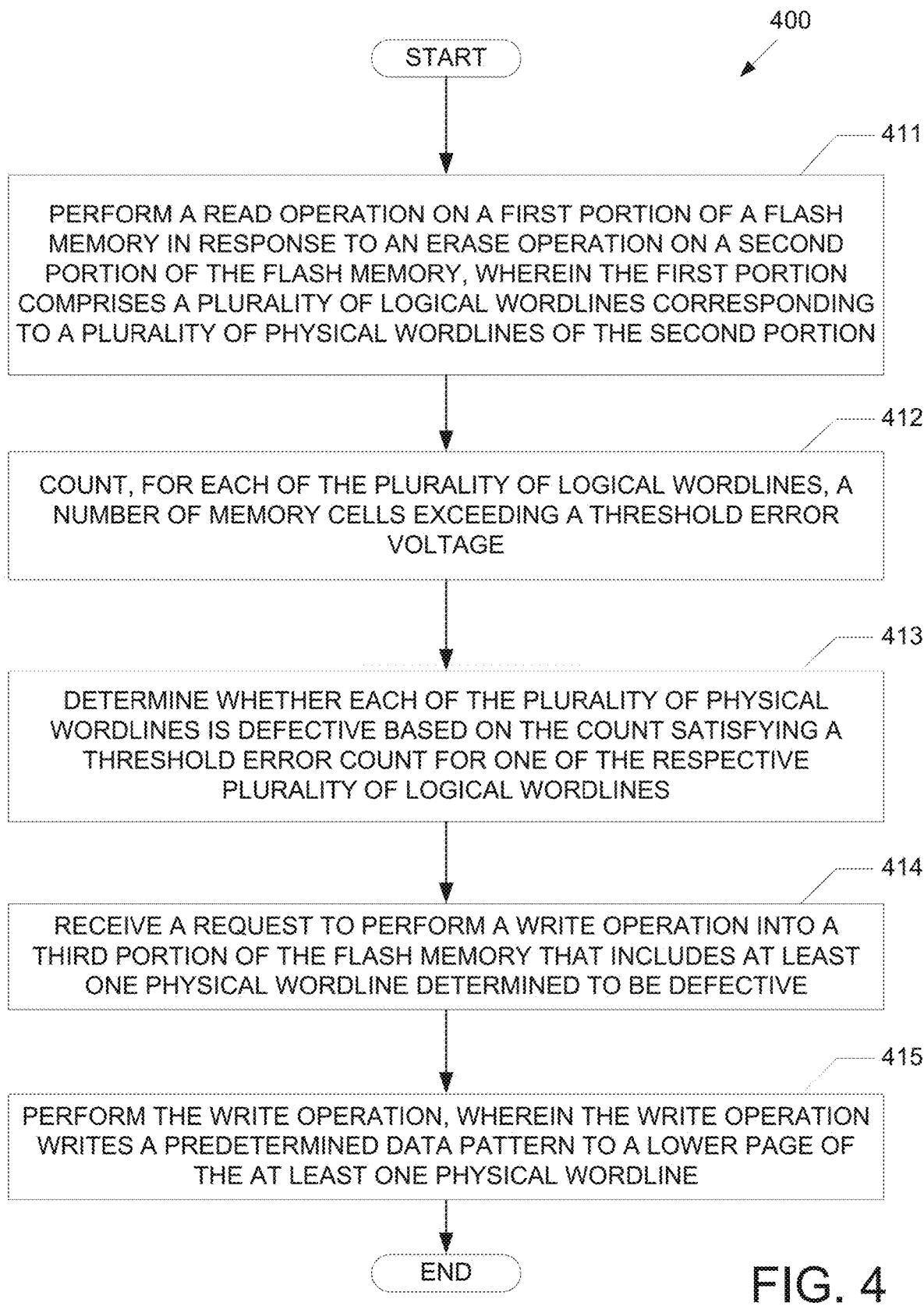
FIG. 4 is a flowchart illustrating an example process for providing pre-program read to counter wordline failures.

FIG. 4 is a flowchart illustrating an example process 400 for providing pre-program read to counter wordline failures. One or more blocks of FIG. 4 may be executed by a computing system (including, e.g., a controller of a flash memory, a data storage controller of a data storage system or a solid state storage device (SSD), a processor, or the like). Examples of a computing system or a controller may be controller 501 and/or 507. Similarly, a non-transitory machine-readable medium may include machine-executable instructions thereon that, when executed by a computer or machine, perform the blocks of FIG. 4. The steps of process 400 may be implemented as hardware/firmware or software.

Figure 5:
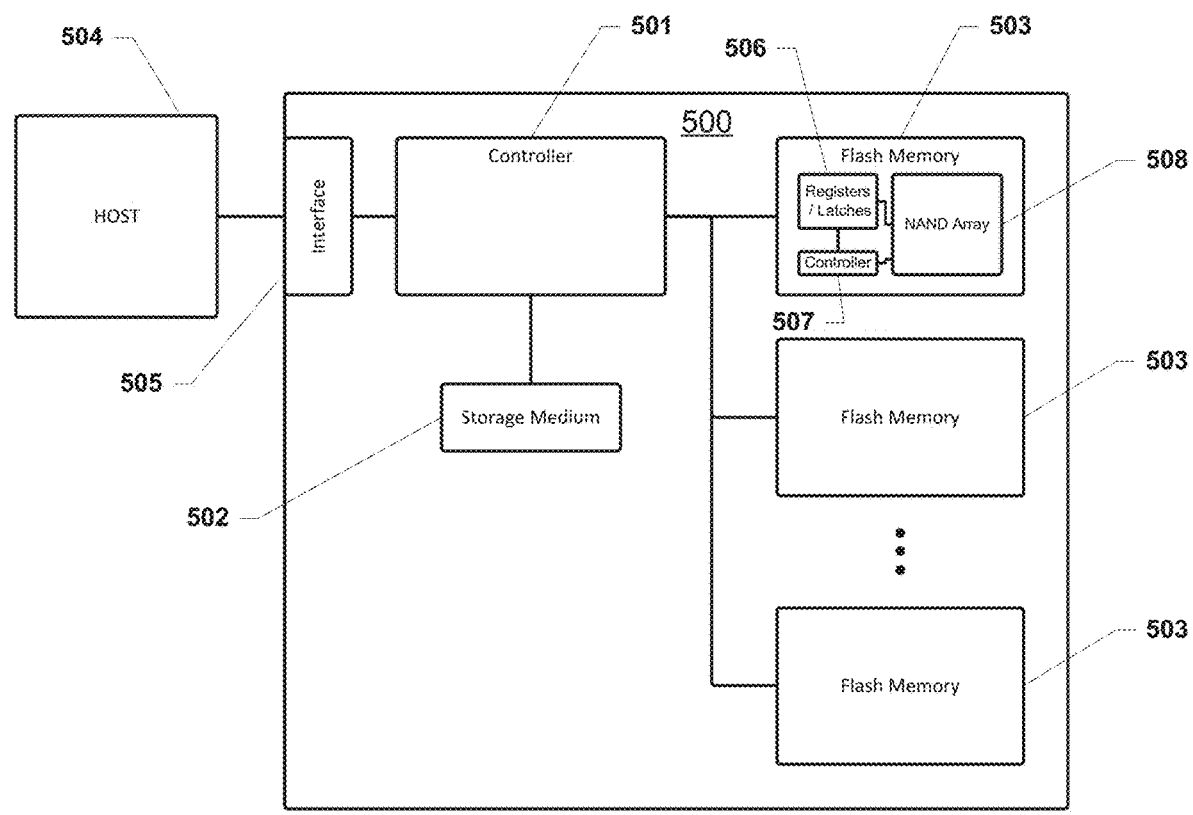
FIG. 5 is a block diagram illustrating components of an example data storage system.

In block 411, referring to FIG. 5, controller 507 performs a read operation on a first portion of NAND array 508 in response to an erase operation on a second portion of NAND array 508. The first portion may comprise a plurality of representative logical wordlines that correspond to a plurality of physical wordlines in the second portion. For example, referring back to circuit 130 of FIG. 1, the representative logical wordlines may correspond to BL<0> to BL<4095> for each physical wordline from WL<0> to WL<j>, wherein the physical wordlines may correspond to all bitlines BL<0> to BL<i>, wherein i>4095, such as i=16383. In this manner, a representative logical wordline can be examined for the presence of the E→A tail in the corresponding physical wordline, rather than examining the entire physical wordline. Thus, the first portion may be a subset of the second portion. Further, the first portion may exclude pages other than lower pages, since the E→A tail is known to primarily affect the erased state to A state transition.

To further reduce the amount of data to be examined, controller 507 may sense current in each of a plurality of strings within the second portion during the erase operation. When the current readings are marginal for a particular string, for example when the current readings are detected to be below a leakage threshold, then the particular string may be identified as likely to include an E→A tail defect. Conversely, strings that are at or above the leakage threshold may be identified as unlikely to include an E→A tail defect. Accordingly, the first portion may be further pruned to include strings identified as likely to include an E→A tail defect based on the sensed current.

For example, referring back to circuit 130 of FIG. 1, a current of string 132 may be sensed as below the leakage threshold, whereas a current of the remaining strings may be sensed as at or above the leakage threshold. In this case, the first portion may include string 132 while excluding the other strings.

In block 412, referring to FIG. 5, controller 507 counts, for each of the plurality of logical wordlines, a number of memory cells exceeding a threshold error voltage. For example, by performing a test read operation at a test voltage, a number of memory cells that read as exceeding the test voltage can be determined, along with a corresponding number of error bits. For example, the test voltage may be set to 0 V, or zero voltage. To perform the counting, the test read data may be sent back to controller 501 for counting at controller 501. Alternatively, latches within registers 506 may be read, wherein the latches count the number of memory cells exceeding the test voltage. In this manner, I/O intercommunication overhead between controller 501 and controller 507 can be avoided.

In block 413, referring to FIG. 5, controller 507 determines whether each of the plurality of physical wordlines is defective based on the counts of block 412 satisfying a threshold error count for the respective plurality of representative logical wordlines. For example, if block 412 results in a particular logical wordline satisfying a particular bit error rate, such as 10 or more bit errors per 4096 bits, then the corresponding physical wordline may be determined to be defective, or affected by the E→A tail defect. In some aspects of the present technology, the E→A tail defects may be recorded in an error bitmap on a physical wordline basis.

In block 414, referring to FIG. 5, controller 507 receives a request to perform a write operation into a third portion of the flash memory that includes at least one physical wordline determined to be defective. For example, controller 501 may issue a write command to controller 507, and controller 507 may examine the error bitmap to determine that the write command includes at least one defective physical wordline.

In block 415, referring to FIG. 5, controller 507 performs the write operation, wherein the write operation writes a predetermined data pattern to a lower page of the at least one defective physical wordline. As discussed above, writing known predetermined padding data to the lower page affected by the E→A tail defect may allow error correction and parity algorithms to proceed more efficiently. The predetermined data pattern may correspond to a repeating data string.

FIG. 5 is a block diagram illustrating components of an example data storage system, according to aspects of the subject technology. As depicted in FIG. 5, in some aspects, data storage system 500 (e.g., a solid state drive) includes data storage controller 501, storage medium 502, and flash memory array 510 including one or more flash memory 503.

Controller 501 may use storage medium 502 for temporary storage of data and information used to manage data storage system 500. Controller 501 may include several internal components (not shown) such as a read-only memory, a flash component interface (e.g., a multiplexer to manage instruction and data transport along a serial connection to flash memory 503), an I/O interface, error correction circuitry, and the like. In some aspects, all of these elements of controller 501 may be integrated into a single chip. In other aspects, these elements may be separated on their own PC board.

In some implementations, aspects of the subject disclosure may be implemented in data storage system 500. For example, aspects of the subject disclosure may be integrated with the function of data storage controller 501 or may be implemented as separate components for use in conjunction with data storage controller 501.

Controller 501 may also include a processor that may be configured to execute code or instructions to perform the operations and functionality described herein, manage request flow and address mappings, and to perform calculations and generate commands. The processor of controller 501 may be configured to monitor and/or control the operation of the components in data storage controller 501. The processor may be a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. One or more sequences of instructions may be stored as firmware on ROM within controller 501 and/or its processor. One or more sequences of instructions may be software stored and read from storage medium 502, flash memory 503, or received from host device 504 (e.g., via host interface 505). ROM, storage medium 502, flash memory 503, represent examples of machine or computer readable media on which instructions/code executable by controller 501 and/or its processor may be stored. Machine or computer readable media may generally refer to any medium or media used to provide instructions to controller 501 and/or its processor, including volatile media, such as dynamic memory used for storage media 502 or for buffers within controller 501, and non-volatile media, such as electronic media, optical media, and magnetic media.

In some aspects, controller 501 may be configured to store data received from a host device 504 in flash memory 503 in response to a write command from host device 504. Controller 501 is further configured to read data stored in flash memory 503 and to transfer the read data to host device 504 in response to a read command from host device 504.

Host device 504 represents any device configured to be coupled to data storage system 500 and to store data in data storage system 500. Host device 504 may be a computing system such as a personal computer, a server, a workstation, a laptop computer, PDA, smart phone, and the like. Alternatively, host device 504 may be an electronic device such as a digital camera, a digital audio player, a digital video recorder, and the like.

In some aspects, storage medium 502 represents volatile memory used to temporarily store data and information used to manage data storage system 500. According to aspects of the subject technology, storage medium 502 is random access memory (RAM) such as double data rate (DDR) RAM. Other types of RAM also may be used to implement storage medium 502. Memory 502 may be implemented using a single RAM module or multiple RAM modules.

While storage medium 502 is depicted as being distinct from controller 501, those skilled in the art will recognize that storage medium 502 may be incorporated into controller 501 without departing from the scope of the subject technology. Alternatively, storage medium 502 may be a non-volatile memory such as a magnetic disk, flash memory, peripheral SSD, and the like.

As further depicted in FIG. 5, data storage system 500 may also include host interface 505. Host interface 505 may be configured to be operably coupled (e.g., by wired or wireless connection) to host device 504, to receive data from host device 504 and to send data to host device 504. Host interface 505 may include electrical and physical connections, or a wireless connection, for operably coupling host device 504 to controller 501 (e.g., via the I/O interface of controller 501). Host interface 505 may be configured to communicate data, addresses, and control signals between host device 504 and controller 501. Alternatively, the I/O interface of controller 501 may include and/or be combined with host interface 505. Host interface 505 may be configured to implement a standard interface, such as Serial-Attached SCSI (SAS), Fiber Channel interface, PCI Express (PCIe), SATA, USB, and the like. Host interface 505 may be configured to implement only one interface. Alternatively, host interface 505 (and/or the I/O interface of controller 501) may be configured to implement multiple interfaces, which may be individually selectable using a configuration parameter selected by a user or programmed at the time of assembly. Host interface 505 may include one or more buffers for buffering transmissions between host device 504 and controller 501.

Flash memory 503 represents a non-volatile memory device for storing data. According to aspects of the subject technology, flash memory 503 includes, for example, a NAND flash memory. Flash memory 503 may include a single flash memory device or chip, or, as depicted by FIG. 5, may include multiple flash memory devices or chips arranged in multiple channels. Flash memory 503 is not limited to any particular capacity or configuration. For example, the number of physical blocks, the number of physical pages per physical block, the number of sectors per physical page, and the size of the sectors may vary within the scope of the subject technology.

Flash memory may have a standard interface specification so that chips from multiple manufacturers can be used interchangeably (at least to a large degree). The interface hides the inner working of the flash and returns only internally detected bit values for data. In aspects, the interface of flash memory 503 is used to access one or more internal registers 506 and an internal flash controller 507 for communication by external devices. In some aspects, registers 506 may include address, command, and/or data registers, which internally retrieve and output the necessary data to and from a NAND memory cell array 508. For example, a data register may include data to be stored in memory array 508, or data after a fetch from memory array 508, and may also be used for temporary data storage and/or act like a buffer. An address register may store the memory address from which data will be fetched to host 504 or the address to which data will be sent and stored. In some aspects, a command register is included to control parity, interrupt control, and the like. In some aspects, internal flash controller 507 is accessible via a control register to control the general behavior of flash memory 503. Internal flash controller 507 and/or the control register may control the number of stop bits, word length, receiver clock source, and may also control switching the addressing mode, paging control, coprocessor control, and the like.

In some aspects, registers 506 may also include a test register. The test register may be accessed by specific addresses and/or data combinations provided at the interface of flash memory 503 (e.g., by specialized software provided by the manufacturer to perform various tests on the internal components of the flash memory). In further aspects, the test register may be used to access and/or modify other internal registers, for example the command and/or control registers. In some aspects, test modes accessible via the test register may be used to input or modify certain programming conditions of flash memory 503 (e.g., read levels) to dynamically vary how data is read from the memory cells of memory arrays 508. Registers 506 may also include one or more data latches coupled to flash memory 503.

It should be understood that in all cases data may not always be the result of a command received from host 504 and/or returned to host 504. In some aspects, Controller 501 may be configured to execute a read operation independent of host 504 (e.g., to verify read levels or BER). The predicate words "configured to", "operable to", and "programmed to" as used herein do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Controller 507 may perform the operations identified in blocks 411-415. Controller 507 may cause the operations identified in blocks 411-415 to occur, or controller 501 may provide instructions to cause or facilitate controller 507 (and registers 506) to perform operations identified in blocks 411-415.

Various examples of aspects of the disclosure are described below. These are provided as examples, and do not limit the subject technology.

One or more aspects of the subject technology provide methods to provide pre-program read to counter wordline failures. According to some aspects, a method may include performing a read operation on a first portion of a flash memory in response to an erase operation on a second portion of the flash memory, wherein the first portion comprises a plurality of logical wordlines corresponding to a plurality of physical wordlines, and wherein the first portion is at least a subset of the second portion. The method may also include counting, for each of the plurality of logical wordlines, a number of memory cells exceeding a threshold error voltage. The method may also include marking, in an error bitmap, whether each of the plurality of physical wordlines is defective based on the count satisfying a threshold error count for the respective one of the plurality of logical wordlines. The method may also include receiving a request to perform a write operation into a third portion of the flash memory that includes at least one physical wordline marked as defective in the error bitmap. The method may also include performing the write operation, wherein the write operation writes a predetermined data pattern to the at least one physical wordline.

In other aspects, a data storage device may include a flash memory and a controller. The controller may be configured to perform a read operation on a first portion of a flash memory in response to an erase operation on a second portion of the flash memory. The controller may also be configured to count, for each of the plurality of wordlines, a number of memory cells exceeding a threshold error voltage. The controller may also be configured to determine whether each of the plurality of wordlines is defective based on the count satisfying a threshold error count. The controller may also be configured to receive a request to perform a write operation into a third portion of the flash memory that includes at least one wordline determined to be defective. The controller may also be configured to perform the write operation, wherein the write operation writes a predetermined data pattern to the at least one wordline.

In further aspects, a system may include means for performing a read operation on a first portion of a flash memory in response to an erase operation on a second portion of the flash memory, wherein the first portion comprises a plurality of representative logical wordlines corresponding to a plurality of physical wordlines of the second portion. The system may also include means for counting, for each of the plurality of representative logical wordlines, a number of memory cells exceeding a threshold error voltage. The system may also include means for determining whether each of the plurality of physical wordlines is defective based on the counting satisfying a threshold error count for the respective one of the plurality of representative logical wordlines. The system may also include means for receiving a request to perform a write operation into a third portion of the flash memory that includes at least one physical wordline determined to be defective. The system may also include means for performing the write operation, wherein the write operation writes a predetermined data pattern to the at least one physical wordline.

In further aspects, a non-transitory machine-readable medium may include machine-executable instructions thereon that, when executed by a processor, perform a method. The method may include performing a read operation on a first portion of a flash memory in response to an erase operation on a second portion of the flash memory, wherein the first portion is at least a subset of the second portion. The method may also include counting, for each of the plurality of wordlines, a number of memory cells exceeding a zero voltage. The method may also include determining whether each of the plurality of wordlines is defective based on the count satisfying a threshold error count. The methods may also include receiving a request to perform a write operation into a third portion of the flash memory that includes at least one wordline determined to be defective. The method may also include performing the write operation, wherein the write operation writes a predetermined data pattern to the at least one wordline.

Various implementations of the methods and systems for pre-program read to counter wordline failures provide several performance advantages that improve the functioning of the storage device. A host computer that interfaces with the storage device is also provided with improved functioning by operating the storage device for a longer lifetime with less performance degradation. Thus, the described methods and systems provide performance benefits that improve the functioning of a storage device and a host computer.

It is understood that other configurations of the subject technology will become readily apparent to those skilled in the art from the detailed description herein, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject technology.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A method, comprising:
    performing a read operation on a first portion of a flash memory in response to an erase operation on a second portion of the flash memory, wherein the first portion comprises a plurality of logical wordlines corresponding to a plurality of physical wordlines of the second portion, and wherein the first portion is at least a subset of the second portion;
    counting, for each of the plurality of logical wordlines, a number of memory cells exceeding a threshold error voltage;
    marking, in an error bitmap, whether each of the plurality of physical wordlines is defective based on the count satisfying a threshold error count for the respective one of the plurality of logical wordlines;
    receiving a request to perform a write operation into a third portion of the flash memory that includes at least one physical wordline marked as defective in the error bitmap; and
    performing the write operation, wherein the write operation writes a predetermined data pattern to the at least one physical wordline,
    wherein:
    the first portion includes first memory cells;
    the second portion includes the first memory cells and second memory cells;
    the second memory cells are different from the first memory cells; and
    in response to the erase operation on the first memory cells and the second memory cells of the second portion, the read operation is performed on the first memory cells but not on the second memory cells.

2. The method of claim 1, wherein the write operation writes the predetermined data pattern to a lower page of the at least one physical wordline.

3. The method of claim 2, wherein the first portion of the flash memory excludes pages other than lower pages of the second portion.

4. The method of claim 2, wherein the erase operation senses a current in each of a plurality of strings within the second portion, and wherein the first portion is selected from the plurality of strings based on whether the sensed current for each of the plurality of strings is below a leakage threshold.

5. The method of claim 1, wherein the predetermined data pattern is not based on data for the write operation.

6. The method of claim 5, wherein the predetermined data pattern comprises a repeating data string.

7. The method of claim 1, wherein the threshold error voltage is a zero (0) voltage.

8. The method of claim 1, wherein the counting comprises one of toggling the first portion of the flash memory to a storage controller or reading latches of the flash memory.

9. The method of claim 1, wherein:
    a first logical wordline of the plurality of logical wordlines corresponds to a first physical wordline of the plurality of physical wordlines;
    the first logical wordline includes fewer memory cells than the first physical wordline;
    the first logical wordline includes a first memory portion of the first memory cells;
    the first physical wordline includes the first memory portion of the first memory cells and a second memory portion of the second memory cells;
    the first memory portion is different from the second memory portion;
    in response to the erase operation on the first physical wordline including the first memory portion and the second memory portion, the read operation is performed on the first memory portion but not on the second memory portion;
    the counting comprises counting, for the first memory portion, a first number of memory cells exceeding the threshold error voltage; and
    the marking comprises marking, in the error bitmap, whether the first memory portion and the second memory portion are defective, based on the first number, for the first memory portion, satisfying the threshold error count, but not based on an error count for the second memory portion.

10. The method of claim 9, wherein:
    the at least one physical wordline is the first physical wordline; and
    the write operation writes the predetermined data pattern to the first memory portion of the first physical wordline but not to the second memory portion of the first physical wordline.

* * * * *